United States Patent
Shangguan

(10) Patent No.: US 11,871,619 B2
(45) Date of Patent: Jan. 9, 2024

(54) ARRAY SUBSTRATE WITH OPTICAL DIELECTRIC LAYER AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Ronggang Shangguan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 715 days.

(21) Appl. No.: 16/957,750

(22) PCT Filed: Apr. 28, 2020

(86) PCT No.: PCT/CN2020/087601
§ 371 (c)(1),
(2) Date: Jun. 25, 2020

(87) PCT Pub. No.: WO2021/159614
PCT Pub. Date: Aug. 19, 2021

(65) Prior Publication Data
US 2023/0141669 A1    May 11, 2023

(30) Foreign Application Priority Data
Feb. 12, 2020 (CN) .......................... 202010088129.8

(51) Int. Cl.
H10K 59/122 (2023.01)
H10K 50/86 (2023.01)
H10K 50/856 (2023.01)
H10K 59/35 (2023.01)

(52) U.S. Cl.
CPC ......... *H10K 59/122* (2023.02); *H10K 50/856* (2023.02); *H10K 50/865* (2023.02); *H10K 59/35* (2023.02)

(58) Field of Classification Search
CPC .. H10K 59/122; H10K 50/856; H10K 50/865; H10K 59/35
See application file for complete search history.

(56) References Cited

U.S. PATENT DOCUMENTS

| 8,237,360 B2 | 8/2012 | Kinoshita | |
|---|---|---|---|
| 8,513,882 B2 | 8/2013 | Kinoshita | |
| 2010/0052524 A1* | 3/2010 | Kinoshita | H10K 50/852 313/506 |

(Continued)

FOREIGN PATENT DOCUMENTS

| CN | 101661951 A | 3/2010 |
|---|---|---|
| CN | 109817832 A | 5/2019 |

(Continued)

*Primary Examiner* — Nduka E Ojeh
(74) *Attorney, Agent, or Firm* — PV IP PC; Wei Te Chung; Zhigang Ma

(57) ABSTRACT

An array substrate and a display panel are provided. The display panel includes the array substrate including a substrate, a driving circuit layer, a planarization layer, a reflective layer, an optical dielectric layer, a black light-shielding layer, a first electrode layer, and a pixel defining layer.

10 Claims, 5 Drawing Sheets

(56) References Cited

U.S. PATENT DOCUMENTS

| | | | |
|---|---|---|---|
| 2010/0219429 A1* | 9/2010 | Cok | H10K 50/865 |
| | | | 257/89 |
| 2016/0197308 A1* | 7/2016 | Jeong | H10K 50/852 |
| | | | 257/40 |
| 2016/0276615 A1 | 9/2016 | Kitabayashi | |
| 2017/0162633 A1 | 6/2017 | Kitabayashi | |
| 2018/0062116 A1* | 3/2018 | Park | H10K 50/852 |
| 2018/0114937 A1* | 4/2018 | Ito | H10K 50/81 |
| 2019/0189720 A1 | 6/2019 | Lim et al. | |
| 2021/0399265 A1* | 12/2021 | Wang | H10K 71/00 |
| 2022/0209128 A1* | 6/2022 | Okuyama | H10K 85/631 |

FOREIGN PATENT DOCUMENTS

| | | |
|---|---|---|
| CN | 110034159 A | 7/2019 |
| CN | 110085775 4 | 8/2019 |

\* cited by examiner

ARRAY SUBSTRATE WITH OPTICAL DIELECTRIC LAYER AND DISPLAY PANEL

FIELD

The present disclosure relates to the field of display technologies, and more particularly, relates to an array substrate and a display panel.

BACKGROUND

Organic light-emitting diode (OLED) display panels are novel flat display devices with exceptional properties, such as self-luminescence, high contrast, smaller thickness, wide viewing angles, fast response times, and capability of being used in flexible display panels, and therefore have a very promising prospect.

In conventional organic electroluminescent diode display panels, there are two electrodes, namely a reflective electrode and a half-transparent-half-reflective electrode. To adjust an optical path length between the two electrodes, a thickness of an organic charge transport layer needs to be adjusted. However, because the most appropriate optical path lengths of red light, green light, and blue light are different, the organic charge transport layer needs to be relatively thick to adjust the optical path lengths, leading to an increase in material costs. Furthermore, a refractivity of conventional organic charge transport materials usually ranges from about 1.5 to 1.8 and is smaller than a refractivity of inorganic materials. As a result, light emitted from organic electroluminescent diode devices is lost at a material interface due to total reflection.

SUMMARY

An objective of the present disclosure is to provide an array substrate and a display panel. By disposing an optical dielectric layer in the array substrate, a portion of an optical path length in organic charge transport layer can be replaced by an optical dielectric layer in an array substrate. Therefore, a thickness of the organic charge transport layer can be reduced without affecting a total optical path length of an organic electroluminescent diode device, thereby effectively decreasing manufacturing costs of the display panel. Furthermore, because the optical dielectric layer has high refractivity, luminescent efficiency can be effectively improved after light is refracted. As a result, the luminescent efficiency of the organic electroluminescent diode device is improved, and power consumption of the display panel is reduced.

To achieve the above goal, the present disclosure provides an array substrate, including a substrate, a driving circuit layer, a planarization layer, a reflective layer, an optical dielectric layer, a black light-shielding layer, a first electrode layer, and a pixel defining layer. Specifically, the driving circuit layer is provided with a plurality of thin film transistor (TFT) units, and each of the TFT units is provided with a drain. The planarization layer is disposed on the driving circuit layer. The reflective layer is disposed on the planarization layer and includes a plurality of reflective units, and each of the reflective units corresponds to one of the TFT units. The optical dielectric layer is disposed on the reflective layer. The black light-shielding layer is disposed on the planarization layer and includes a plurality of black light-shielding units, and the black light-shielding units and the reflective units are alternately disposed with each other. The first electrode layer is disposed on the optical dielectric layer and includes a plurality of anodes, and each of the anodes corresponds to the reflective layer and the drain, and passes through a through hole to connect to the drain. The pixel defining layer is disposed on the black light-shielding units and includes a plurality of pixel defining units, and two adjacent pixel defining units define a pixel defining notch.

Furthermore, a material of the pixel defining layer and a material of the black light-shielding layer are same or different.

Furthermore, a bottom of the through hole is the drain, and the through hole sequentially penetrates the planarization layer and one of the black light-shielding units from bottom to top, or sequentially penetrates the planarization layer, the reflective layer, and the optical dielectric layer from bottom to top.

Furthermore, a material of the reflective layer includes an alloy including one or more of Ag, Al, Mg, and Ti.

Furthermore, a material of the optical dielectric layer includes TiOx, NbOx, ZnOx, CeOx, TaOx, MoOx, SiNx, ITO, IZO, ZnSx, or ZnSex.

Furthermore, a material of the first electrode layer includes Ag, Mg, ITO, IZO, or an Mg—Ag alloy. A visible light transmittance of the first electrode layer is greater than or equal to 60%, and a sheet resistance of the first electrode layer is smaller than or equal to 100Ω/□.

Furthermore, a depth of the pixel defining notch ranges from 1 μm to 3 μm.

The present disclosure further provides a display panel, including the array substrate, an organic luminescent layer, a second electrode layer, a light extraction layer, a sacrificial protective layer, and an encapsulation layer. Specifically, the organic luminescent layer is disposed on the array substrate and includes a plurality of red pixel units, a plurality of green pixel units, and a plurality of blue pixel units. The second electrode layer is disposed on the organic luminescent layer. The light extraction layer is disposed on the second electrode layer. The sacrificial protective layer is disposed on the light extraction layer. The encapsulation layer is disposed on the sacrificial protective layer.

Furthermore, a refractivity of a material of the organic luminescent layer is smaller than a refractivity of a material of the optical dielectric material.

Furthermore, one pixel defining notch is provided with two blue pixel units.

Furthermore, an optical path length $L_R$ from centers of the red pixel units to the reflective layer is represented by:

$$L_R = \frac{2m+1}{4}\lambda_R.$$

An optical path length $L_G$ from centers of the green pixel units to the reflective layer is represented by:

$$L_G = \frac{2m+1}{4}\lambda_G.$$

An optical path length $L_B$ from centers of the blue pixel units to the reflective layer is represented by:

$$L_B = \frac{2m+1}{4}\lambda_B.$$

m is an integer, and $\lambda_R$, $\lambda_G$, and $\lambda_B$ are respectively wavelengths of red light, green light, and blue light.

Regarding the beneficial effects: the present disclosure provides an array substrate and a display panel. By dividing a reflective electrode of conventional organic electroluminescent diode display panels into two parts, and introducing an optical dielectric layer between the two parts, a portion of an optical path length in organic charge transport layer having can be replaced by the optical dielectric layer in the array substrate. Therefore, a thickness of an organic charge transport layer can be reduced without affecting a total optical path length of an organic electroluminescent diode device, thereby effectively decreasing manufacturing costs of the display panel. Furthermore, compared with a structure of conventional organic electroluminescent diode devices, in the present disclosure, because the optical dielectric layer has high refractivity, luminescent efficiency can be effectively improved after light is refracted. As a result, the luminescent efficiency of the organic electroluminescent diode device is improved, and power consumption of the display panel is reduced.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
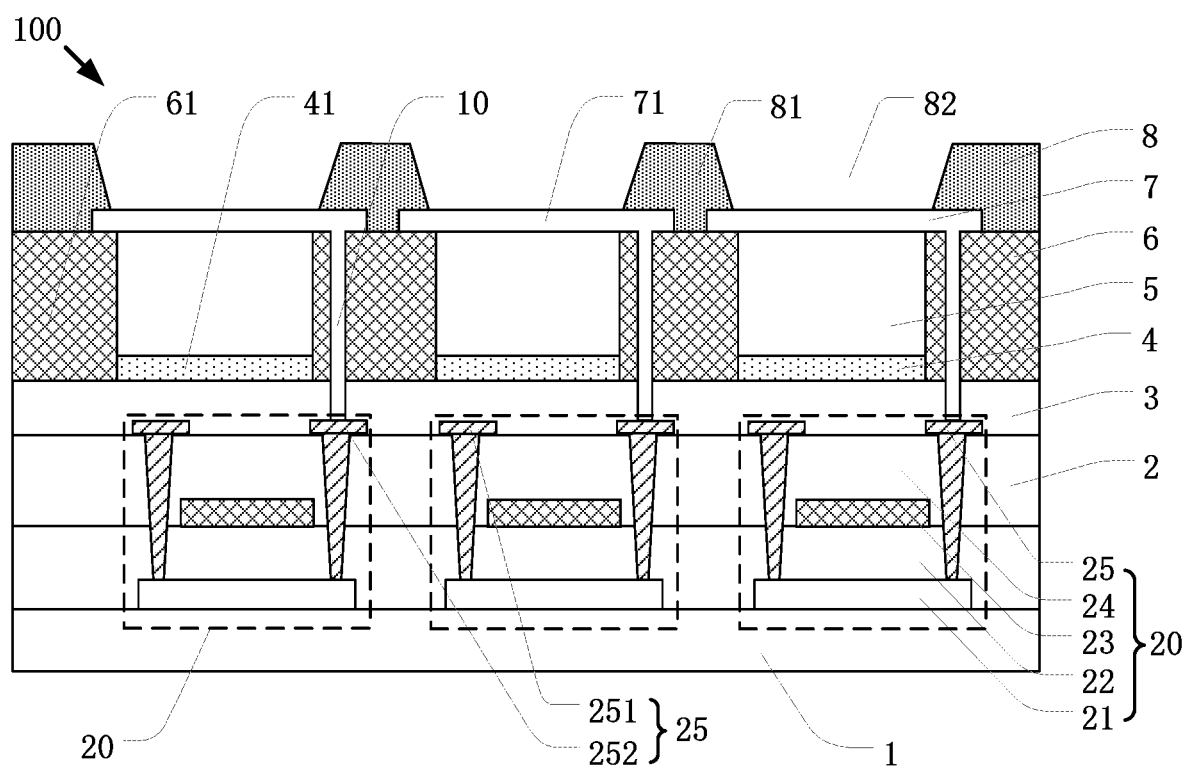
FIG. 1 is a schematic structural view showing an array substrate according to a first embodiment of the present disclosure.

The following description of the various embodiments is provided with reference to the accompanying drawings to demonstrate the embodiments of the present disclosure. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

Drawings in the present disclosure are only for demonstrating a relative position relationship and an electrical connection relationship. Thicknesses of some parts are exaggerated in the drawings for ease of understanding, which does not represent a proportional relationship between actual layer thickness.

First Embodiment

Please refer to FIG. 1, the first embodiment of the present disclosure provides an array substrate 100, including a substrate 1, a driving circuit layer 2, a planarization layer 3, a reflective layer 4, an optical dielectric layer 5, a black light-shielding layer 6, a first electrode layer 7, and a pixel defining layer 8.

Specifically, the driving circuit layer 2 is provided with a plurality of thin film transistor (TFT) units 20, and each of the TFT units 20 is provided with a drain 252. The planarization layer 3 is disposed on the driving circuit layer 2. The reflective layer 4 is disposed on the planarization layer 3 and includes a plurality of reflective units 41, and each of the reflective units 41 corresponds to one of the TFT units 20. The optical dielectric layer 5 is disposed on the reflective layer 4. The black light-shielding layer 6 is disposed on the planarization layer 3 and includes a plurality of black light-shielding units 61. The black light-shielding units 61 are spaced apart from the reflective units 41 and are configured to block light or absorb horizontal light. The first electrode layer 7 is disposed on the optical dielectric layer 5 and includes a plurality of anodes 71. Each of the anodes 71 corresponds to the reflective layer 4 and the drain 252, and is electrically connected to the source 252 by a through hole 10. The pixel defining layer 8 is disposed on the black light-shielding units 61 and includes a plurality of pixel defining units 81. Two adjacent pixel defining units 81 define a pixel defining notch 82. In other words, the black light-shielding units 61 are disposed right under the pixel defining units 81 in a one-to-one correspondence relationship.

The pixel defining notch 82 is defined on an organic luminescent layer disposed between two electrodes, thereby forming a plurality of red, green, and blue pixel units. Because the most appropriate optical path lengths of red light, green light, and light are different, an optical path length needs to be adjusted. A portion of an optical path length in the luminescent layer is replaced by an optical path length in the optical dielectric layer 5, and a total optical path length remains unchanged. Therefore, a thickness of the organic luminescent layer can be reduced, materials costs can be saved, and manufacturing costs can be reduced.

The through hole 10 and the pixel defining notch 82 are formed by a patterning process with yellow light.

To further increase a light-shielding effect, in the present embodiment, a material of the pixel defining layer 8 and a material of the black light-shielding layer 6 are same. That is, the pixel defining layer 8 is also black and is also configured to block light or absorb horizontal light.

It should be noted that the material of the pixel defining layer 8 and the material of the black light-shielding layer 6 may also be different to achieve different functions or effects.

In the present embodiment, a bottom of the through hole 10 is the drain 252. The through hole 10 sequentially penetrates the planarization layer 3 and the black light-shielding units 61 from bottom to top.

In the present embodiment, a material of the reflective layer 4 includes an alloy including one or more of Ag, Al, Mg, and Ti. A thickness of the reflective layer 4 ranges from 50 nm to 300 nm, and preferably, ranges from 100 nm to 200 nm.

In the present embodiment, a material of the optical dielectric layer 5 includes any one of TiOx, NbOx, ZrOx, ZnOx, CeOx, TaOx, SiNx, ITO, IZO, ZnSx, or ZnSex.

In the present embodiment, a material of the first electrode layer 7 includes an Ag, Mg, ITO, IZO, or an Mg—Ag alloy. A visible light transmittance of the first electrode layer 7 is greater than or equal to 60%, and preferably, is greater than or equal to 80%. A sheet resistance of the first electrode layer 7 is smaller than or equal to 100Ω/□, and preferably, is smaller than or equal to 30Ω/□.

In the present embodiment, a depth of the pixel defining notch 82 ranges from 1 μm to 3 μm, and preferably, ranges from 1.5 μm to 2.5 μm.

Please refer to FIG. 1, each of the TFT units 20 of the driving circuit layer 2 sequentially includes an active layer 21, a gate insulating layer 22, a gate layer 23, an interlayer insulating layer 24, and a source/drain layer 25 from bottom to top. The source/drain layer 25 includes a source 251 and the drain 252. The gate insulating layer 22 and the interlayer insulating layer 24 are formed from inorganic layers, such as SiN and SiOx, in a stacked manner. The active layer 21 is a low-temperature polycrystalline silicon layer formed from low-temperature polycrystalline silicon. A material of the gate layer 23 includes Mo. The source/drain layer 25 has a Ti/Al/Ti stacked structure.

Second Embodiment

Figure 2:
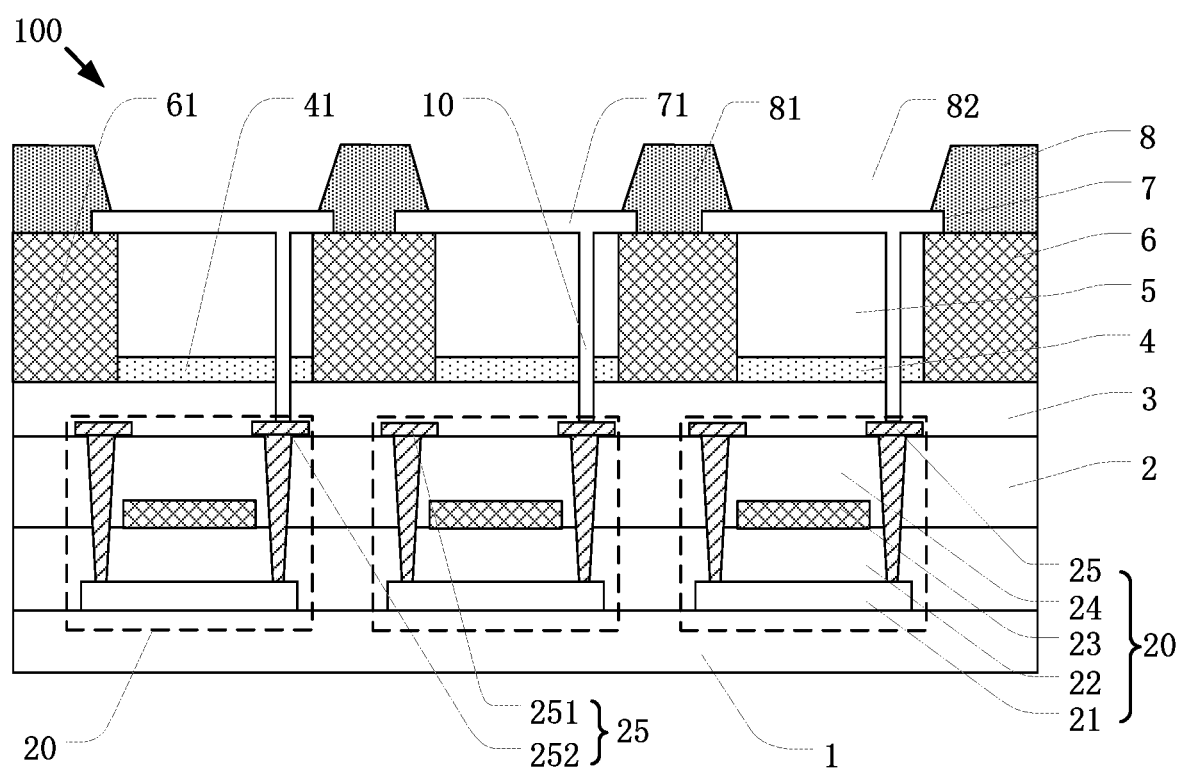
FIG. 2 is a schematic structural view showing an array substrate according to a second embodiment of the present disclosure.

Please refer to FIG. 2, the second embodiment includes most technical characteristics in the first embodiment, and a difference therebetween is: in the second embodiment, the through hole 10 sequentially penetrates the planarization layer 3, the reflective layer 4, and the optical dielectric layer 5 from bottom to top, unlike in the first embodiment where the through hole 10 sequentially penetrates the planarization layer 3 and the black light-shielding units 61 from bottom to top. The through hole 10 in the above two embodiments are configured to realize an electrical connection between the TFT units 20 and the drains 252.

Figure 3:
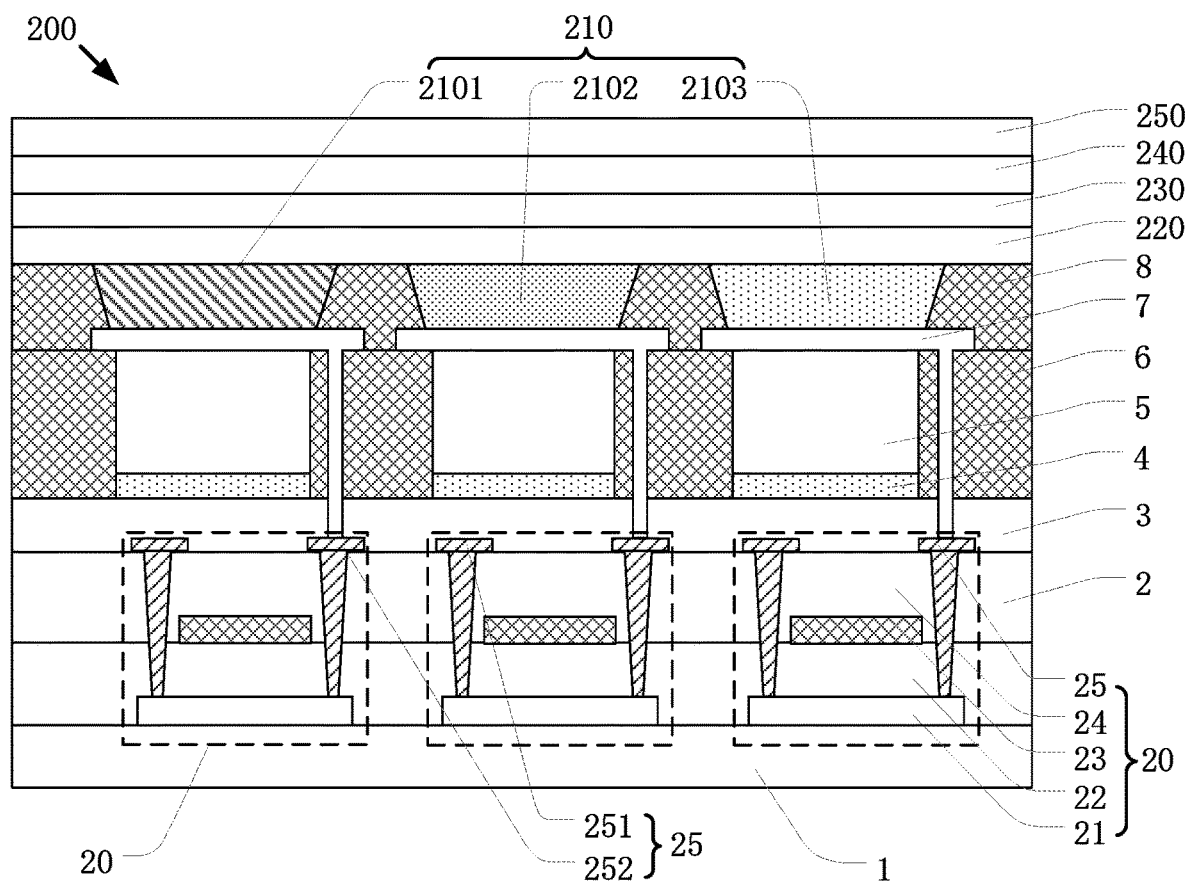
FIG. 3 is a schematic structural view showing a display panel according to an embodiment of the present disclosure.

Please refer to FIG. 3, an embodiment of the present disclosure further provides a display panel 200, including the array substrate 100, an organic luminescent layer 210, a second electrode layer 220, a light extraction layer 230, a sacrificial protective layer 240, and an encapsulation layer 250. Specifically, the organic luminescent layer 210 is disposed on the array substrate 100 and includes a plurality of red pixel units 2101, a plurality of green pixel units 2102, and a plurality of blue pixel units 2103. The second electrode layer 220 is disposed on the organic luminescent layer 210. Preferably, the second electrode layer 220 is a cathode. The light extraction layer 230 is disposed on the second electrode layer 220. The sacrificial protective layer 240 is disposed on the light extraction layer 230. The encapsulation layer 250 is disposed on the sacrificial protective layer 240.

In the present embodiment, a refractivity of a material of the organic luminescent layer 240 is smaller than that of the optical dielectric layer 5. Because the optical dielectric layer 5 having high refractivity, luminescent efficiency can be effectively improved after light is refracted, thereby reducing power consumption of the display panel 200.

Figure 4:
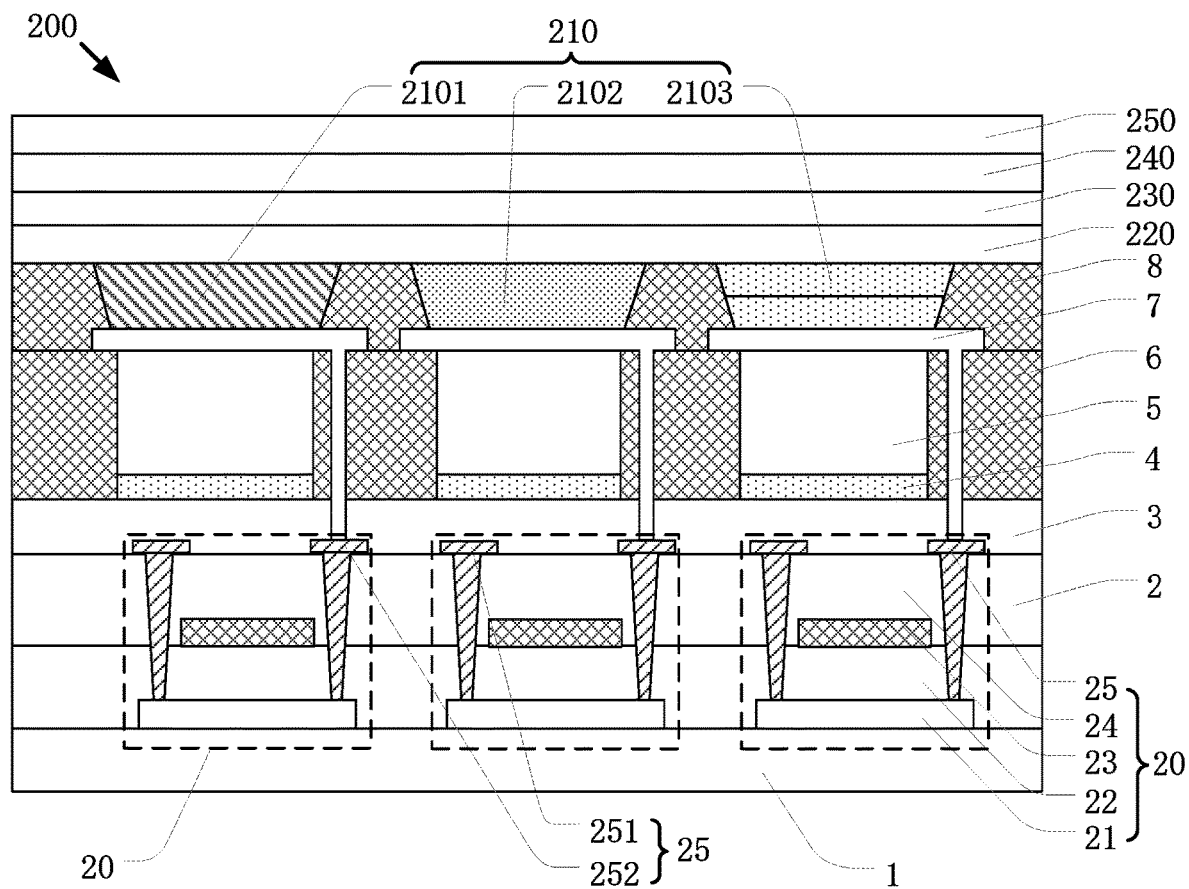
FIG. 4 is a schematic structural view showing another display panel according to an embodiment of the present disclosure.

Please refer to FIG. 4, in another embodiment, one the pixel defining notches 82 is provided with two blue pixel units 2103. The blue pixel units 2103 have a tandem structure, which means they are stacked on each other, thereby increasing a brightness of blue light. Furthermore, sizes of openings of the red pixel units 2101, the green pixel units 2102, and the blue pixel units 2103 are different. In other words, sizes of openings of the pixel defining notches 82 are different. An opening area of the pixel defining notches 82 corresponding to the blue pixel units 2103 is greater than an opening area of the pixel defining notches 82 corresponding to the red pixel units 2101 and an opening area of the pixel defining notches 82 corresponding to the green pixel units 2102. It should be understood that the tandem structure that includes two stacked blue pixel units 2103 can be applied to the array substrate 100 mentioned in the first embodiment and the second embodiment.

In the present embodiment, an optical path length $L_R$ from centers of the red pixel units 2101 to the reflective layer 4 is represented by:

$$L_R = \frac{2m+1}{4}\lambda_R,$$

an optical path length $L_G$ from centers of the green pixel units 2102 to the reflective layer 4 is represented by:

$$L_G = \frac{2m+1}{4}\lambda_G,$$

and an optical path length $L_B$ from centers of the blue pixel units 2103 to the reflective layer 4 is represented by:

$$L_B = \frac{2m+1}{4}\lambda_B,$$

wherein m is an integer, and $\lambda_R$, $\lambda_G$, and $\lambda_B$ are respectively wavelengths of red light, green light, and blue light.

In the present embodiment, the organic luminescent layer 210 is formed by vacuum vapor-deposition or inkjet printing.

Figure 5:
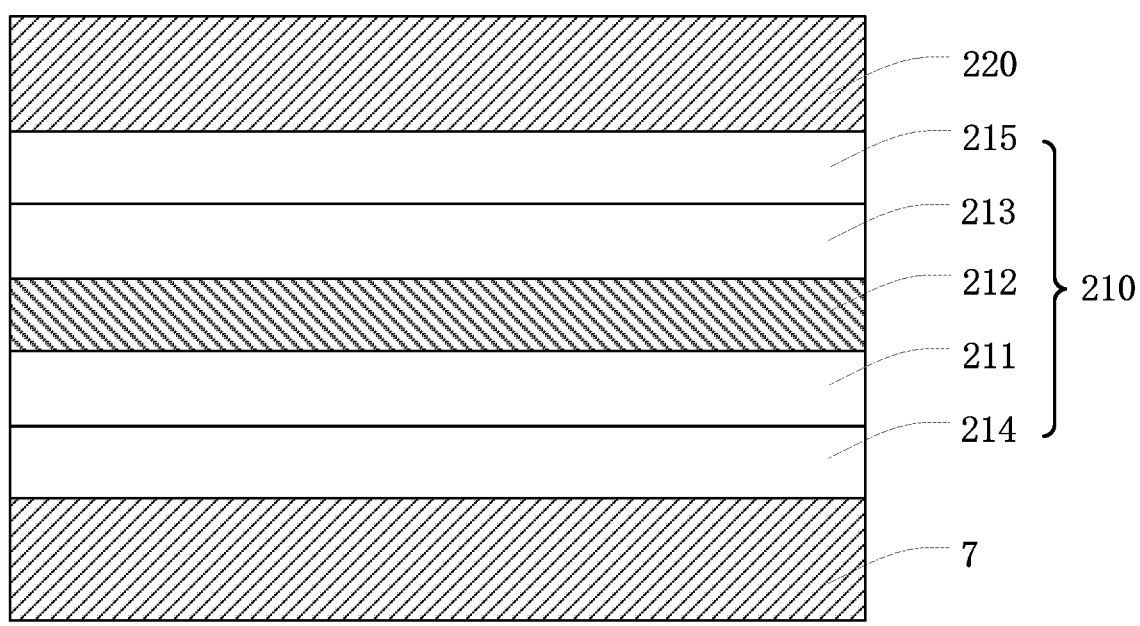
FIG. 5 is a schematic structural view showing a relative positional relationship between layers of organic luminescent layer.

Please refer to FIG. 5, the organic luminescent layer 210 sequentially includes a first charge transport layer 211, a luminescent layer 212, and a second charge transport layer 213 from bottom to top. A first charge injection layer 214 may be further disposed between the first electrode layer 7 and the first charge transport layer 211. A second charge injection layer 215 may be further disposed between the second electrode layer 220 and the second charge transport layer 213. A color of light emitted from the organic luminescent layer 210 can be red, green, or blue. Light emitted from the organic luminescent layer 210 in two adjacent pixel defining notches 82 have different colors. That is, the pixel defining notches 82 where the red pixel units 2101 are disposed, the pixel defining notches 82 where the green pixel units 2102 are disposed, and the pixel defining notches 82 where the blue pixel units 2103 are disposed are not adjacent to each other.

By adjusting each/every thickness of the optical dielectric layer 5, the first electrode layer 7, the first charge injection layer 214, and the first charge transport layer 211, an optical path length from centers of the organic luminescent layer 210 to the reflective layer 4 can be adjusted. An objective of controlling the optical path length is to ensure that the center of the organic luminescent layer 210 can be positioned at a position satisfying the above equations, thereby realizing high luminescent efficiency.

By introducing the optical dielectric layer 5, a portion of an optical path length in the first charge injection layer 214 and a portion of an optical path length in the first organic transport layer 211 can be replaced by an optical path length in the optical dielectric layer 5, and a total optical path length remains unchanged. Therefore, a thickness of the first injection layer 214 and a thickness of the first organic transport layer 211 can be reduced, materials costs can be saved, and manufacturing costs can be reduced.

Regarding the beneficial effects: the present disclosure provides an array substrate 100 and a display panel 200. By dividing a reflective electrode of conventional organic electroluminescent diode display panels into two parts, and introducing an optical dielectric layer 5 between the two parts, an optical path length in an organic charge transport layer can be replaced by the optical dielectric layer 5 in the array substrate 100. Therefore, a thickness of an organic charge transport layer can be reduced without affecting a total optical path length of an organic electroluminescent diode device, thereby effectively decreasing manufacturing costs of the display panel 200. Furthermore, compared with a structure of conventional organic electroluminescent diode devices, in the present disclosure, because the optical dielectric layer 5 has high refractivity, luminescent efficiency can be effectively improved after light is refracted. As a result, the luminescent efficiency of the organic electroluminescent diode device is improved, and power consumption of the display panel 200 is reduced.

The above are merely preferred embodiments of the present invention. It is understood that many changes and modifications to the described embodiment can be carried out without departing from the scope and the spirit of the disclosure that is intended to be limited only by the appended claims.

What is claimed is:

1. An array substrate, comprising:
   a substrate;
   a driving circuit layer, wherein the driving circuit layer is provided with a plurality of thin film transistor (TFT) units, and each of the TFT units is provided with a drain;
   a planarization layer disposed on the driving circuit layer;
   a reflective layer disposed on the planarization layer, wherein the reflective layer comprises a plurality of reflective units, and each of the reflective units corresponds to one of the TFT units;
   an optical dielectric layer disposed on the reflective layer;
   a black light-shielding layer disposed on the planarization layer, wherein the black light-shielding layer comprises a plurality of black light-shielding units, and the black light-shielding units and the reflective units are alternately disposed with each other;
   a first electrode layer disposed on the optical dielectric layer, wherein the first electrode layer comprises a plurality of anodes, and each of the anodes corresponds to the reflective layer and the drain, and passes through a through hole to connect to the drain; and
   a pixel defining layer disposed on the black light-shielding units, wherein the pixel defining layer comprises a plurality of pixel defining units, and two adjacent pixel defining units define a pixel defining notch, one pixel defining notch is provided with two blue pixel units stacked on each other.

2. The array substrate of claim 1, wherein a material of the pixel defining layer and a material of the black light-shielding layer are same.

3. The array substrate of claim 1, wherein a bottom of the through hole is the drain, and the through hole sequentially penetrates the planarization layer, the reflective layer, and the optical dielectric layer from bottom to top.

4. The array substrate of claim 1, wherein a material of the reflective layer comprises an alloy comprising one or more of Ag, Al, Mg, and Ti.

5. The array substrate of claim 1, wherein a material of the optical dielectric layer comprises any one of TiOx, NbOx, ZnOx, CeOx, TaOx, MoOx, SiNx, ITO, IZO, ZnSx, or ZnSex.

6. The array substrate of claim 1, wherein a depth of the pixel defining notch ranges from 1 μm to 3 μm.

7. The display panel of claim 1, wherein a bottom of the through hole is the drain, and the through sequentially penetrates the planarization layer and one of the black light-shielding units from bottom to top.

8. A display panel, comprising:
   an array substrate, comprising:
   a substrate;
   a driving circuit layer, wherein the driving circuit layer is provided with a plurality of thin film transistor (TFT) units, and each of the TFT units is provided with a drain;
   a planarization layer disposed on the driving circuit layer;
   a reflective layer disposed on the planarization layer, wherein the reflective layer comprises a plurality of reflective units, and each of the reflective units corresponds to one of the TFT units;
   an optical dielectric layer disposed on the reflective layer;
   a black light-shielding layer disposed on the planarization layer, wherein the black light-shielding layer comprises a plurality of black light-shielding units, and the black light-shielding units and the reflective units are alternately disposed with each other;
   a first electrode layer disposed on the optical dielectric layer, wherein the first electrode layer comprises a plurality of anodes, and each of the anodes corresponds to the reflective layer and the drain, and passes through a through hole to connect to the drain; and
   a pixel defining layer disposed on the black light-shielding units, wherein the pixel defining layer comprises a plurality of pixel defining units, and two adjacent pixel defining units define a pixel defining notch, one pixel defining notch is provided with two blue pixel units stacked on each other;
   an organic luminescent layer disposed on the array substrate, wherein the organic luminescent layer comprises a plurality of red pixel units, a plurality of green pixel units, and a plurality of blue pixel units;
   a second electrode layer disposed on the organic luminescent layer;
   a light extraction layer disposed on the second electrode layer;
   a sacrificial protective layer disposed on the light extraction layer; and an encapsulation layer disposed on the sacrificial protective layer.

9. The display panel of claim 8, wherein a refractivity of a material of the organic luminescent layer is smaller than a refractivity of a material of the optical dielectric material.

10. The display panel of claim 8, wherein an optical path length LR from centers of the red pixel units to the reflective layer is represented by:

$$L_R = \frac{2m+1}{4} \lambda_R;$$

an optical path length LG from centers of the green pixel units to the reflective layer is represented by:

$$L_G = \frac{2m+1}{4}\lambda_G;$$

an optical path length LB from centers of the blue pixel units to the reflective layer is represented by:

$$L_B = \frac{2m+1}{4}\lambda_B;$$

and
wherein m is an integer, and λR, λG, and λB are respectively wavelengths of red light, green light, and blue light.

* * * * *